United States Patent [19]

Kober et al.

[11] Patent Number: 5,229,192
[45] Date of Patent: Jul. 20, 1993

[54] FLAME-RESISTANT COVER FILM FOR FLEXIBLE CIRCUIT BOARDS

[75] Inventors: Horst Kober, Weinheim-Oberflockenbach; Thomas Kuhlmann, Heidelberg; Jorg Hausdorf, Morlenbach; Steffen Kosack, Hassloch; Werner Schäfer, Birkenau; Volker Siekermann, Furth, all of Fed. Rep. of Germany

[73] Assignee: Firma Carl Freudenberg, Weinheim/Bergstr., Fed. Rep. of Germany

[21] Appl. No.: 748,690

[22] Filed: Aug. 21, 1991

[30] Foreign Application Priority Data

Aug. 21, 1990 [DE] Fed. Rep. of Germany ....... 4026353

[51] Int. Cl.$^5$ ............................................. B32B 9/00
[52] U.S. Cl. .................................. 428/209; 428/901; 361/398; 430/286; 174/250
[58] Field of Search ................ 430/286; 428/209, 901; 361/398; 174/250

[56] References Cited

U.S. PATENT DOCUMENTS

| 4,075,420 | 2/1978 | Walton | 174/117 |
| 4,195,997 | 4/1980 | Graham | 430/286 |
| 4,311,749 | 1/1982 | Hiraiwa et al. | 428/209 |
| 4,314,002 | 2/1982 | Oizumi et al. | 428/414 |

FOREIGN PATENT DOCUMENTS 2211852 12/1989 United Kingdom .

Primary Examiner—Patrick J. Ryan
Assistant Examiner—Cathy Lee
Attorney, Agent, or Firm—Kenyon & Kenyon

[57] ABSTRACT

A flame-resistant cover film for flexible circuit boards having excellent flame-resistance, handling, and storage qualities may be produced by treating an insulating film of a nonwoven polymer fabric with a flame-resistant, halogen-free polymeric adhesive. The polymeric adhesive comprises an aqueous mixture of a copolymerizate of acrylic acid esters and styrene, and an aminoplastic or phenoplastic precondensate to which a mixture of fine-particle red phosphorus and fine-particle ammonium polyphosphate is also added.

2 Claims, No Drawings

FLAME-RESISTANT COVER FILM FOR FLEXIBLE CIRCUIT BOARDS

The present invention relates to a flame-resistant cover film for flexible circuit boards comprising an insulating film of a nonwoven polymer fabric treated with a polymer adhesive system that includes flame retardants.

BACKGROUND OF THE INVENTION

Flexible printed circuits have gained widespread use in applications where flexing is a functional requirement, such as where flexing facilitates assembly and disassembly, or other dimensional variations need to be accommodated. In general, flexible circuits are formed by bonding a metal foil, such as a copper foil, onto a flexible insulating film or substrate such as a polyester resin film. A circuit is formed in the metal foil by conventional etching techniques.

Flexible printed circuits may be covered with an additional layer of a similar insulating film or substrate to provide additional insulation and to protect the circuit pattern from contamination, corrosion, and mechanical damage. The cover film may also be necessary for the formation of a symmetrical layered structure and/or a solder stop mask.

Conventional cover films may be made of polyester or polyimide polymers. Holes may be introduced into the film so that solder "eyes" to the flexible circuit boards remain clear. The cover film may be bonded to the flexible circuit board with a heat-activated adhesive coating under pressure and heat.

A disadvantage of using a heat-activated adhesive to effect such bonding is that such adhesives flow when subjected to pressure and heat. Thus, any holes that have been introduced into the cover film may be occluded by the flowing adhesive, reducing the available solder surface beneath them. The extent of adhesive flow is difficult to control, since it depends, among other things, its degree of polymerization and the proportion of volatile components in the adhesive.

One approach to control the problem of flowing adhesives has been to employ a non-flowing adhesive. However, this method is also associated with its own problems. For example, the non-flowing adhesive can trap air that cannot be completely displaced. The trapped air leaves voids that may permit solder to migrate below the cover film during hot-tinning or soldering.

Another problem associated with flexible printed circuit boards is that heat generated by a current flowing through a circuit can cause the substrate, the insulating film, or the adhesive, to be ignited. Thus, flexible printed circuit boards have a potential to cause fire in instruments and devices utilizing such circuit boards. A proposed solution to this problem is to include flame retardants in the cover film adhesive.

U.S. Pat. No. 4,075,420 is directed to a cover layer for flexible circuit boards. The disclosed cover layer is formed by a three-layer laminate, which includes an insulation film layer, a thermosetting adhesive layer and a phenolic resin layer. The phenolic resin layer connects the cover film to a flexible circuit board.

U.S. Pat. No. 4,311,749 is directed to a flame-proof flexible printed circuit board which includes a flexible resin film and a copper foil electric circuit, bonded together with an adhesive. The flexible resin film is treated to provide a surface tension of 36 dyne/cm, or more, and a resin film containing a flame retardant is applied to the treated surface of the flexible resin film.

OBJECTS AND SUMMARY OF THE INVENTION

It is an object of the present invention to provide a cover film utilizing a non-flowing, "dry" adhesive system, which can be laminated without the formation of bubbles.

It is also an object of the present invention to provide a cover film in which openings can be introduced, e.g., by drilling or punching, and which does not promote solder migration under the film during hot-tinning processes or soldering.

It is a further object of the present invention to provide a flame-resistant cover film for flexible circuit boards that avoids the use of adhesives containing solvents.

Another object of the present invention is to provide a cover film that is flame resistant but does not include halogenated flame inhibitors.

It is a further object of the present invention to provide a bond between a cover film and a flexible circuit board that possesses a peel resistance equal or greater than 0.4 N/mm, that is resistant to solder baths (about 290° C., 20 s), and that is capable of meeting the standards of UL 94, Class V0.

The invention provides a flame-resistant cover film for flexible circuit boards comprising a polymeric nonwoven fabric combined with an aqueous, flame-resistant, halogen-free polymeric adhesive including (a) a cross-linked product of an aqueous dispersion of a thermally cross-linkable copolymerizate of acrylic acid esters and styrene, and (b) an aqueous solution of precondensate containing hydroxymethyl groups selected from the group comprising of aminoplastics and phenoplastics. The polymeric adhesive further include a flame retardant such as a mixture of red phosphorus and ammonium polyphosphate.

This invention also provides a method for adhering a cover film to a flexible printed circuit under heat and pressure.

It is known that the aforementioned copolymerizate and precondensate are individually suited for coating, laminating, and adhesive purposes. It was unexpected, however, that a mixture of these ingredients, in combination with the halogen-free, flame-retardant mixture, would result in a composition that meets the aforementioned requirements of flexible circuit boards.

DETAILED DESCRIPTION OF THE INVENTION

The flame-resistant cover film according to the invention includes an insulating film of a nonwoven polymer fabric to which a polymeric adhesive is applied by coating or impregnation in an amount in the range of about 30 to 60 g/m² (dry). The polymeric adhesive is comprised of a cross-linked product of:
(a) about a 50% aqueous dispersion of a thermally cross-linkable copolymerizate of acrylic acid esters and styrene, where the copolymerizate has a glass transition temperature of about +31° C.;
(b) about a 60% aqueous solution of a precondensate including hydroxymethyl groups, selected from the group consisting of aminoplastics and phenoplastics; and (c) having a ratio of (a) to (b) (dry) of about 10.0:0.8 to about 10.0:2.0.

The ratio of the 50% aqueous dispersion of the copolymerizate to the 60% aqueous solution of an aminoplastic or phenoplastic precondensate containing hydroxymethyl groups is preferably in the range of 10.0:0.8 to 10.0:2.0 (dry) in order to obtain a chemical cross-linked product. If the proportion of precondensate is greater, the resulting adhesive may be brittle and tend to form bubbles. Conversely, if the proportion of precondensate is smaller, the resulting product maybe too low in cross-linking density.

To satisfy UL 94 (Class V0) flame-inhibiting standards, a finely dispersed flame-retardant mixture of red phosphorus and ammonium polyphosphate (in a ratio of about 1.0:10.0) is added to the adhesive in an approximate ratio of about 1.0:0.9. The grain size of the red phosphorus ranges from about 0.045 to 0.10 mm, and the grain size of the ammonium polyphosphate ranges from about 0.025 to 0.075 mm. A phosphorus concentration outside the suggested concentration may result in an adhesive that does not meet UL 94 (Class V0) standards. Furthermore, in one embodiment of the invention, a finely dispersed distribution of the flame-retardant mixture in the cross-linked system is necessary.

The components described above may be mixed in a high-speed stirrer to form a flame-resistant adhesive. The flame-resistant adhesive may be brushed, spread with a doctor blade or spreader, or printed on the insulating film. Cutouts or bolts of the insulating film may be coated or impregnated, dried at about 100° to 120° C. for about ten minutes, and subsequently applied to the flexible circuit board under pressure and heat. The coated and dried insulating film, however, may be stored for weeks before application to a flexible circuit board without significant loss of advantageous qualities.

The above-described ingredients are commercially available: the 50% aqueous dispersion of the thermally cross-linkable copolymerizate of acrylic acid esters and styrene with a glass transition temperature of +31° C. is available under the tradename Acronal S 886 S (BASF); the 60% aqueous solution, containing hydroxymethyl groups, of an aminoplastic or phenoplastic precondensate, is available under the tradename Casurit F (Hoechst); the red phosphorus with a grain size from 0.045 to 0.10 mm is available under the tradename Exolit 405 (Hoechst); and the ammonium polyphosphate with a grain size from 0.025 to 0.075 mm is available under the tradename Exolit 422 (Hoechst).

The adhesive of the invention is aqueous and does not contain a halogen associated flame inhibitor. Thus, the adhesive of the present invention eliminates the usual protective and disposal procedures necessary with the use of non-aqueous, solvent-based adhesives and halogen containing flame inhibitors.

The following example illustrates the application of the flame-resistant cover film of the instant invention to a flexible circuit board. The 50% aqueous dispersion of a thermally cross-linkable copolymerizate of acrylic acid esters and styrene having a glass transition temperature of +31° C., and the 60% aqueous solution, containing hydroxymethyl groups, of an aminoplastic or phenoplastic precondensate, are mixed in a high-speed stirrer together with the red phosphorus and the ammonium polyphosphate, both as described above. The mixture is applied on a nonwoven, polyamide-polyester fabric to form an insulating film having the following specifications:

| | |
|---|---|
| Area weight: | 49 g/m$^2$ |
| Thickness: | 0.071 mm |
| Maximum tensile strength: | 134 N |
| Expansion: | 24% |
| Air permeability: | 207 dm$^3$/s/m$^2$ | by application with a doctor blade, in an amount of 40 g/m$^2$ (dry). Cutouts of the insulating film of nonwoven fabric are produced, dried at 110° C. for 10 minutes, and subsequently adhered to the flexible circuit board, under pressure at 200° C.

What is claimed is:

1. A flame-resistant flexible printed circuit board comprising:
    a flexible printed circuit board, an aqueous, halogen-free polymeric composition applied in an amount of about 30 to 60 g/m$^2$ (dry) to an insulating film, wherein said insulating film comprises a nonwoven fabric having the following specifications: area weight: 49 g/m$^2$, thickness: 0.071 mm, maximum tensile strength: 134 N, expansion: 24%, and air permeability: 207 dm$^3$/s/m$^2$, and said polymeric composition comprises a cross-linked product of:
    (a) about a 50% aqueous dispersion of a thermally cross-linkable copolymerizate of acrylic acid esters and styrene having a glass transition temperature of about +31° C.,
    (b) about a 60% aqueous solution including hydroxymethyl groups, selected from the group consisting of aminoplastics and phenoplastics,
    where the ratio of (a):(b) (dry) is about 10.0:0.8 to 10.0:2.0,
    (c) red phosphorus with a grain size of 0.045 to 0.10 mm, and
    (d) ammonium polyphosphate with a grain size of 0.025 to 0.075 mm are added, where the ratio of (c):(d) is about 1.0:10.0, and the ratio of ((a)+(b)) to ((c)+(d)) is about 1.0:09, and
    said insulating film is adhered to said flexible printed circuit board under heat and pressure.

2. A flame-resistant flexible printed circuit board comprising:
    a flexible printed circuit board,
    an aqueous, halogen-free polymeric composition applied in an amount of 40 g/m$^2$ (dry) to an insulating film, wherein said insulating film comprises a nonwoven fabric having the following specifications: area weight: 49 g/m$^2$, thickness: 0.071 mm, maximum tensile strength: 134 N, expansion: 24%, and air permeability: 207 dm$^3$/s/m$^2$, and said polymeric composition comprises a cross-linked product of:
    (a) a 50% aqueous dispersion of a thermally cross-linkable copolymerizate of acrylic acid esters and styrene having a glass transition temperature of about +31° C.,
    (b) a 60% aqueous solution including hydroxymethyl groups, selected from the group consisting of aminoplastics and phenoplastics,
    where the ratio of (a):(b) (dry) is about 10.0:0.8 to 10.0:2.0,
    (c) red phosphorus with a grain size of 0.045 to 0.10 mm, and
    (d) ammonium polyphosphate with a grain size of 0.025 to 0.075 mm are added, where the ration of (c):(d) is about 1.0:10.0, and the ratio of ((a)+(b)) to ((c)+(d)) is about 1.0:0.9, and
    said insulating film is adhered to said flexible printed circuit board under heat and pressure.

* * * * *